(12) United States Patent
Manack et al.

(10) Patent No.: US 9,321,631 B2
(45) Date of Patent: Apr. 26, 2016

(54) METHOD FOR EMBEDDING CONTROLLED-CAVITY MEMS PACKAGE IN INTEGRATION BOARD

(71) Applicant: Texas Instruments Incorporated, Dallas, TX (US)

(72) Inventors: Christopher Daniel Manack, Lantana, TX (US); Frank Stepniak, Allen, TX (US); Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/490,924

(22) Filed: Sep. 19, 2014

(65) Prior Publication Data

US 2015/0004739 A1    Jan. 1, 2015

Related U.S. Application Data

(62) Division of application No. 13/405,513, filed on Feb. 27, 2012, now Pat. No. 8,866,237.

(51) Int. Cl.
| | |
|---|---|
| *B81C 1/00* | (2006.01) |
| *B81B 7/00* | (2006.01) |
| *G01J 5/12* | (2006.01) |
| *G01J 5/04* | (2006.01) |
| *H01L 23/00* | (2006.01) |

(52) U.S. Cl.
CPC ........... *B81C 1/00246* (2013.01); *B81B 7/0067* (2013.01); *G01J 5/045* (2013.01); *G01J 5/12* (2013.01); *H01L 24/24* (2013.01); *H01L 24/82* (2013.01); *H01L 24/97* (2013.01); *B81B 2201/0207* (2013.01); *B81C 1/00269* (2013.01); *H01L 2224/04105* (2013.01); *H01L 2224/12105* (2013.01); *H01L 2224/16225* (2013.01); *H01L 2224/24245* (2013.01); *H01L 2224/32245* (2013.01); *H01L 2224/82039* (2013.01); *H01L 2224/92144* (2013.01); *H01L 2224/97* (2013.01); *H01L 2924/10253* (2013.01); *H01L 2924/10271* (2013.01); *H01L 2924/10329* (2013.01);

(Continued)

(58) Field of Classification Search
CPC ......... H01L 24/97; H01L 24/82; H01L 24/24; H01L 2224/24245; H01L 2224/12105; H01L 2924/10271; H01L 2224/82039; H01L 2224/97; H01L 2924/10329; H01L 2224/32245; G01J 5/045; G01J 5/12; B81B 7/0067

See application file for complete search history.

(56) References Cited

U.S. PATENT DOCUMENTS 4,695,719 A * 9/1987 Wilwerding ............. G02B 3/00
250/208.2
5,818,094 A 10/1998 Matsuo
(Continued)

FOREIGN PATENT DOCUMENTS

CN    101313202 A    11/2008
CN    101786594 A    7/2010

OTHER PUBLICATIONS

CN101013202A English Machine Translation.
(Continued)

*Primary Examiner* — Roy Potter
*Assistant Examiner* — Paul Patton
(74) *Attorney, Agent, or Firm* — Steven A. Shaw; Frank D. Cimino

(57) ABSTRACT

A method for fabricating a micro-electro-mechanical system (MEMS) provides a semiconductor chip having a cavity with a radiation sensor MEMS. The opening of the cavity at the chip surface is covered by a plate transmissive to the radiation sensed by the MEMS. A patterned metal film is placed across the plate surface remote from the cavity.

9 Claims, 3 Drawing Sheets

(52) U.S. Cl.
CPC ............... *H01L 2924/12042* (2013.01); *H01L 2924/1433* (2013.01); *H01L 2924/1434* (2013.01); *H01L 2924/1461* (2013.01)

(56) References Cited

U.S. PATENT DOCUMENTS

2005/0051905 A1* 3/2005 Dangelmaier ...... H01L 23/3121 257/778
2007/0172991 A1 7/2007 Schaadt
2010/0276716 A1 11/2010 Kwon et al.

OTHER PUBLICATIONS

CN101786594A English Machine Translation.
The State Intellectual Property Office of P.R.C notification of first office action and search report, sent Sep. 30, 2015.

* cited by examiner

METHOD FOR EMBEDDING CONTROLLED-CAVITY MEMS PACKAGE IN INTEGRATION BOARD

CROSS REFERENCE TO RELATED APPLICATIONS

This application is a Divisional of and claims priority to U.S. patent application Ser. No. 13/405,513 filed on Feb. 27, 2012. Said application incorporated herein by reference.

FIELD

Embodiments of the invention are related in general to the field of semiconductor devices and processes, and more specifically to the structure and fabrication method of embedded micro-mechanical device (MEMS) packages with a nook for the sensor chip exposed to ambient.

DESCRIPTION OF RELATED ART

The wide variety of products collectively called Micro-Electro-Mechanical devices (MEMS) are small, low weight devices on the micrometer to millimeter scale, which may have mechanically moving parts and often movable electrical power supplies and controls, or they may have parts sensitive to thermal, acoustic, or optical energy. MEMS have been developed to sense mechanical, thermal, chemical, radiant, magnetic, and biological quantities and inputs, and produce signals as outputs. Because of the moving and sensitive parts, MEMS have a need for physical and atmospheric protection. Consequently, MEMS are placed on a substrate and have to be surrounded by a housing or package, which has to shield the MEMS against ambient and electrical disturbances, and against stress.

A Micro-Electro-Mechanical System (MEMS) integrates mechanical elements, sensors, actuators, and electronics on a common substrate. The manufacturing approach of a MEMS aims at using batch fabrication techniques similar to those used for microelectronics devices. MEMS can thus benefit from mass production and minimized material consumption to lower the manufacturing cost, while trying to exploit the well-controlled integrated circuit technology.

An example of MEMS includes mechanical sensors, both pressure sensors including microphone membranes, and inertial sensors such as accelerometers coupled with the integrated electronic circuit of the chip. The mechanically moving parts of a MEMS are fabricated together with the sensors and actuators in the process flow of the electronic integrated circuit (IC) on a semiconductor chip. The mechanically moving parts may be produced by an undercutting etch at some step during the IC fabrication; examples of specific bulk micromachining processes employed in MEMS sensor production to create the movable elements and the cavities for their movements are anisotropic wet etching and deep reactive ion etching.

Another example is an 8-pin digital infrared (IR) temperature sensor made in a silicon chip of about 2 by 2 mm side length, which includes a thermopile (multiple thermo-elements) of bismuth/antimony or constantan/copper pairs on a sensor membrane suspended in a cavity created by anisotropic silicon wet etching through a grid of holes (hole diameter about 18 µm, hole pitch about 36 µm center-to-center) in the membrane. The cavity is closed by a laminate cover-plate (about 14 µm thick) overlaying the membrane to protect the sensors, and the IR radiation reaches the thermocouple tips through the rear silicon bulk of the cavity. The resulting hot spot on the thermocouple tips creates a temperature difference between the tips and the opposite thermocouple ends at ambient temperature, which in turn creates the voltage difference to be monitored as a contactless temperature measurement. For the 8 pins, the chip may have 8 solder bumps surrounding the cover plate-protected cavity or 8 pressure contacts and is thus commonly referred to as a wafer-chip-scale package (WCSP); in the modification with pressure (or solderable) contacts, the package belongs to the Quad Flat No-Lead (QFN) family.

Following the technology trends of miniaturization, integration and cost reduction, substrates and boards have recently been developed which can embed and interconnect chips and packages in order to reduce board space, thickness, and footprint while increasing power management, electrical performance, and fields of application. Examples include penetration of integrated boards into the automotive market, wireless products, and industrial applications.

As examples, integration boards have been successfully applied to embed wafer level packages, passives, power chips, stacked and bonded chips, wireless modules, power modules, generally active and passive devices for applications requiring miniaturized x/y areas and shrinking thickness in z-dimension.

SUMMARY OF THE INVENTION

Applicants realized that a wide field of industrial, automotive and consumer applications would open up if a MEMS device such as a sensor could safely and cost-effectively be embedded in miniaturized boards as part of a larger integrated system, which may include additional one or more single or stacked chips. For a MEMS to operate in an immersed location in an integration board, the integration would need to allow an unobstructed access of the physical entity-to-be-monitored to the MEMS; the integration board has to leave a window for light, sound, gas, moisture, etc. to transmit through. In the example of a temperature sensor, the IR radiation would need unobstructed access to the IR sensor located in a cavity; this means the cavity has must have a controlled opening to the ambient. A person skilled in the art realizes the multitude of wafer fabrication and chip assembly steps in a production process flow to produce an embedded MEMS and thus the problem of protecting the sensor through the sequence of steps.

Applicants solved the problem of protecting the MEMS through the fabrication flow and opening the cavity for the access to the ambient only at the conclusion of the multi-step flow, when they discovered that a stack of two layers, an adhesive layer on a patterned metal film on the plate, placed across the MEMS cavity cover plate will do the job of protecting the MEMS in the cavity through all following laser and etch steps of the process flow. The protective metal film is placed across the cavity cover plate in the silicon wafer front-end process flow while the chip is not yet singulated from the wafer, and the adhesive layer is attached on the metal film in the initial step of immersing the chip into the integration board.

An embodiment of the invention is a method for fabricating a MEMS by placing a patterned metal film across the plate surface remote from the cavity in a chip, wherein the cavity includes a radiation sensor MEMS and the opening of the cavity at the chip surface is covered by a plate transmissive to the radiation sensed by the MEMS. Another embodiment of the invention is a method for fabricating an embedded MEMS by attaching the metal film, which is on the plate surface remote from the cavity, and the chip surface onto a patterned conductive foil covered by a layer of adhesive; then embedding the non-attached chip body in an insulating board; and removing form the cover plate sequentially portions of the conductive foil, then of the adhesive layer, and then of the metal film, thereby exposing the plate to the radiation to be sensed by the MEMS in the cavity.

Another embodiment of the invention is a MEMS with a semiconductor chip embedded in an insulating board. The chip has a cavity including a radiation sensor MEMS; the opening of the cavity at the chip surface is covered by a plate transmissive to the radiation sensed by the MEMS. The plate surface remote from the cavity has a bare central area, to be exposed to the radiation sensed by the MEMS in the cavity, and a peripheral area covered by a metal film touching the plate surface and a layer of adhesive stacked on the metal film. The radiation to be sensed by the MEMS may be an electromagnetic radiation, such as visible or infrared light, or it may by acoustic radiation, such as sound, or chemical radiation, such as gases.

Another embodiment of the invention includes a vertical stack of two semiconductor chips embedded in an insulating board, wherein one of the chips is a radiation-sensing MEMS in a cavity with plate-covered opening, and the other chips contains a microprocessor or a memory.

Yet another embodiment of the invention is a combination of two MEMS. One MEMS is a board-embedded chip with a plate-covered cavity including a radiation sensor, the other MEMS includes an emitter of radiation, either embedded in or attached to the integration board, or another sensor responding to a different element.

BRIEF DESCRIPTION OF THE DRAWINGS

FIG. 2 depicts a portion of a semiconductor wafer prepared with a plurality of cavities covered by a plate.

FIG. 3 shows the steps of placing a patterned metal film across the plate surface and singulating the chips.

FIG. 4 illustrates the step of inserting a chip into an adhesive layer on a conductive foil.

FIG. 5 depicts the step of forming an insulating embedding matrix surrounding the chip and attached to the conductive foil.

FIG. 6 shows the step of using a laser to expose the chip terminals and to create a plurality of via-holes through the insulating embedment.

FIG. 7 illustrates the steps of plating metal in the via-holes and across the insulating board; etching the plated metal to expose the adhesive layer over the central area of the cavity plate; and depositing solder masks on both board sides.

FIG. 8 depicts the steps of removing the exposed adhesive layer (by laser) and the metal film (by etch) in the central plate area, freeing the cover plate to the radiation to be sensed by the MEMS in the cavity.

DETAILED DESCRIPTION OF PREFERRED EMBODIMENTS

Figure 1:
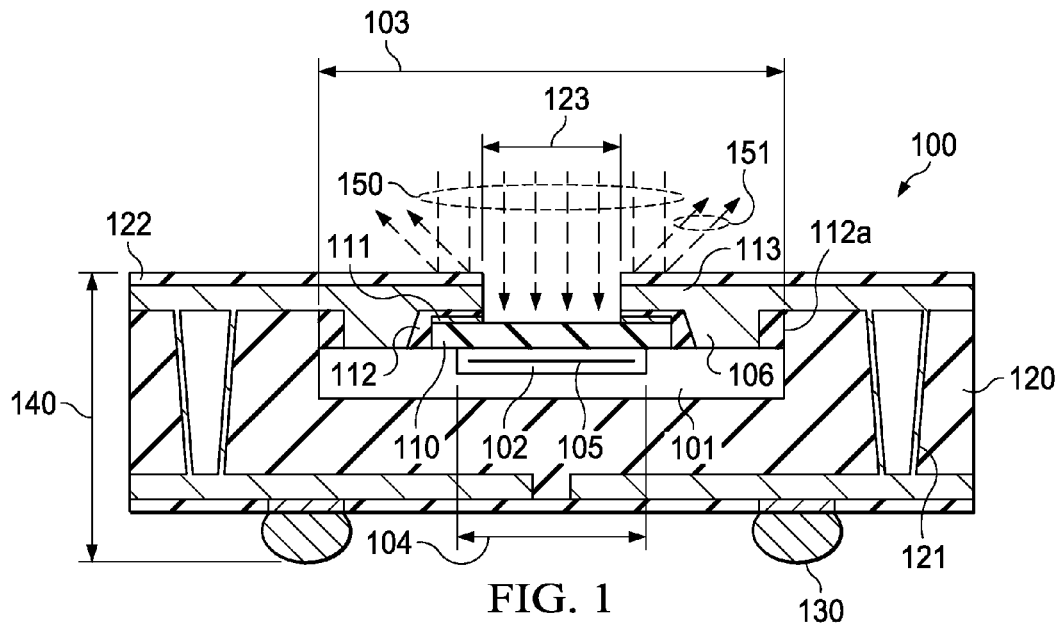
FIG. 1 shows an exemplary radiation-sensing micro-electro-mechanical system (MEMS) embedded in an insulating board according to the invention.

FIG. 1 illustrates an exemplary embodiment of the invention, a device generally designated 100. The device includes a semiconductor chip 101 with terminals 106; chip 101 is embedded in an insulating board 120. Chip 101 contains a cavity 102 with a micro-electro-mechanical system (MEMS) 105. An exemplary chip suitable as an infrared-sensing MEMS may be square-shaped with a side length 103 of about 2 mm. Board 120 has a plurality of solder bumps 130 attached for interconnection of device 100 to external parts. As an example, the height 140 of board 120 together with solder bumps 130 may be approximately 1 mm.

Chip 101 has a cavity 102 with an opening 104 facing the surface of chip 101 and the top side of device 100. In the exemplary embodiment of FIG. 1, inside cavity 102 is MEMS 105 preferably a radiation sensor. Exemplary sensors may be selected from a group responsive to electro-magnetic radiation, such as visible or infrared light, to acoustic radiation, such as sound, and to chemical radiation, such as gases. A preferred example as sensor in FIG. 1 is a digital infrared (IR) temperature sensor including a thermopile (multiple thermoelements) of bismuth/antimony or constantan/copper pairs on a sensor membrane 105. The membrane is suspended in cavity 102 created by anisotropic silicon wet etching through a grid of holes (hole diameter about 18 µm, hole pitch about 36 µm center-to-center) in the membrane.

As FIG. 1 shows, the opening of cavity 102 is closed by a laminate cover-plate 110 (about 15 µm thick) overlaying the membrane to protect the sensors; the plate is transmissive to the radiation sensed by the MEMS. In the example of FIG. 1, the center area of plate 110 is bare so that the IR radiation 150 can reach the thermocouple tips through the plate. For this example, a preferred material of the plate is cured photoresist. Since the opening 104 of cavity 102 and MEMS 105 face the incoming radiation 150, the sensitivity of MEMS 105 is considerably enhanced compared to an arrangement where the radiation is received by the MEMS through the bulk semiconductor as a filter—an important advantage for industrial applications of device 100. As a result of the incoming radiations, a hot spot on the thermocouple tips creates a temperature difference between the tips and the opposite thermocouple ends, which are at ambient temperature; the temperature difference in the thermocouples creates the voltage difference to be monitored as a contactless temperature measurement.

In the embodiment of FIG. 1, the peripheral areas of the plate surface remote from cavity 102 are not bare as the center plate area, but have a plurality of material layers stacked on the surface. Touching the surface of plate 110 is a metal film 111, which served as a protective layer in process steps using $CO_2$ lasers (see below). Metal film 111 preferably includes a titanium-tungsten layer of about 0.15 µm thickness on cover plate 110 and a copper layer of about 0.20 µm thickness on the titanium-tungsten layer. Alternatively, film 111 may just be copper.

Stacked on metal film 111 is a layer 112 of cured (polymerized) adhesive material. It is preferably an epoxy-based insulating compound in the preferred thickness range between 10 and 20 µm, but may be thinner or thicker. Layer 112 originates from the assembly process step (see below), when the face of chip 101 with its terminals and the metal-film-covered plate was immersed in an adhesive layer printed on a supporting conductive foil; at this stage, the adhesive compound of the layer is not cured yet. Somewhat thicker regions 112a of adhesive epoxy at the periphery of chip terminals are also remnants of the immersion assembly step.

Touching adhesive layer 112 is a region of conductive material generally designated 113. Preferably, the conductive material comprises copper. Integrated into the unified conductive region are material, such as copper, deposited preferably by a plating technique, and material from a conductive foil, such as copper foil. The foil has been mentioned above for the process step of attaching chip 101 face-down by an adhesive layer. Conductive material 113 also contacts the chip terminals 106.

The insulating compound of board 120 can be selected from a group of composites, which are mechanically strong and insensitive to variations of temperature and moisture. An example of board materials includes pressed layers of glass-fiber enforced plastic. Integral to board 120 are a plurality of conductive via-holes 121, which allow electrical connection vertically through board 120.

As FIG. 1 shows, both sides of board 120 preferably have a protective layer 122; a preferred choice of material is a solder mask, which can serve as the basis for symbolization. Since the opening of protective layer 122 can be designed so that it approximately follows the perimeter of the cavity opening 104, but is not wider than opening 104, layer 122 can act to limit the field of view. As a consequence, cavity 102 becomes a controlled cavity. This feature is an advantage for precision measurements of incoming radiation 150. In FIG. 1, opening 123 of protective layer 122 is shown concentric with, but significantly narrower than cavity opening 104. FIG. 1 indicates schematically the reflectivity of layer 122 by refracted rays 151.

Figure 2:
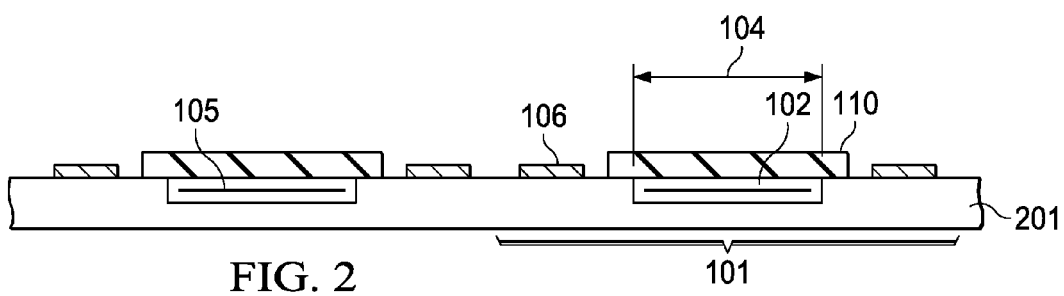
FIGS. 2 to 8 illustrate certain steps of the fabrication method to protect the MEMS through the manufacturing flow of creating the chip with a cavity including the MEMS and embedding the chip in an interconnection board.
Figure 3:
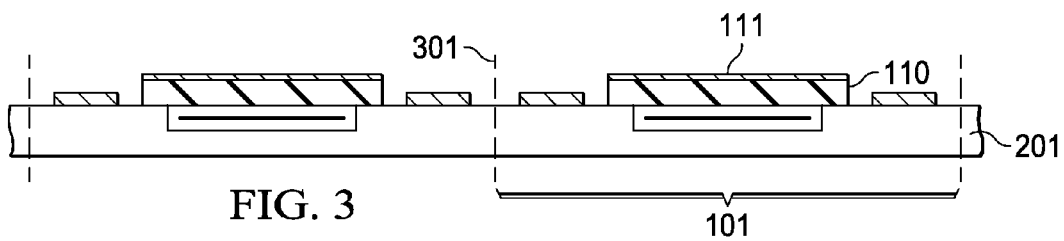

Other embodiments of the invention are a method for fabricating a micro-electro-mechanical system (MEMS), illustrated in FIGS. 2 and 3, and a method for fabricating an embedded MEMS, illustrated in FIGS. 3 to 8. FIG. 2 depicts a portion of a semiconductor wafer 201 prepared with a plurality of chips 101; each chip has terminals 106. Further, each chip has a cavity 102 and inside the cavity a MEMS 105; an exemplary MEMS is a radiation sensor. The opening 104 of cavity 102 is covered by a plate 110, which is transmissive to the radiation sensed by the MEMS. For infrared radiation sensing MEMS, a preferred material for plate 110 is a laminate cured photoresist, and a preferred thickness is between 10 and 20 µm, more preferably about 15 µm.

FIG. 3 depicts the process step of depositing and patterning a metal film 111 across the plate surface remote from the cavity. A preferred deposition method is sputtering, and a preferred metal includes a titanium-tungsten layer of about 0.15 µm thickness on cover plate 110 and a copper layer of about 0.20 µm thickness on the titanium-tungsten layer. Alternatively, film 111 may just be copper. Also shown in FIG. 3 are the steps of backgrinding and singulating wafer 201; the step of singulation is preferably performed by sawing along lines 301. The individual chips 101 may be placed in tape and reel for transport to assembly and packaging process steps.

Figure 4:
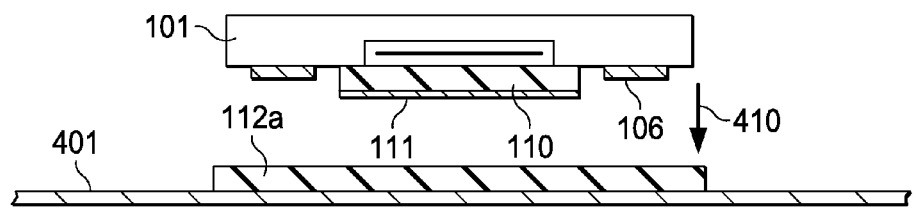
Figure 5:
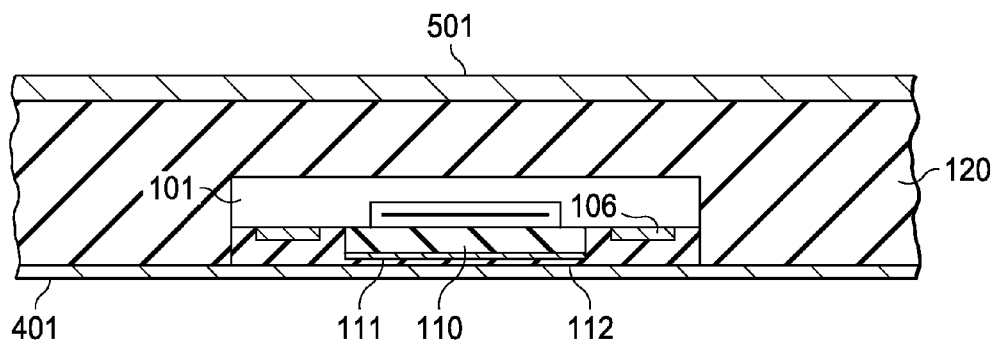

In the next process steps, illustrated in FIG. 4, a layer 112a of polymeric adhesive is spread across a conductive foil 401. The polymeric adhesive has not yet been subjected to the curing (polymerization) cycle and has thus low viscosity; layer 112a preferably has a thickness greater than 25 µm. A preferred material for polymeric adhesive is a B-stage epoxy chip-attach compound, and a preferred material for the conductive foil is copper. A chip 101, with its terminals 106 and the metal film 111 on the cavity plate 110 facing the adhesive layer 112a, is aligned with the layer 112a of polymeric adhesive. Then, chip 101 is lowered (arrow 410) to touch layer 112a and slightly pressured to immerse its terminals 106 and metal film 111 and plate 110 into adhesive 112a. As indicated in FIG. 5, by this assembly action the thickness of layer 112a is reduced from >25 µm to 10 to 20 µm, herein designated 112; the polymeric adhesive may remain somewhat thicker at the chip terminals 106, since they may be thinner than plate 110. After adhesively attaching chip 101 to conductive foil 401, the polymeric material of layer 112 is polymerized (hardened).

In the process step displayed in FIG. 5, insulating compound is laid around the five cuboid sides of chip 101, which are not attached to conductive foil 401 with the goal of embedding the non-attached chip body in insulating board 120. Suitable insulating compound may be selected from a group of composites, which are mechanically strong and insensitive to variations of temperature and moisture. An example of an insulating compound includes pressed layers of glass-fiber enforced plastic. It is preferred that another conductive foil 501 (for instance a copper foil) is placed on the board side opposite foil 401.

Figure 6:
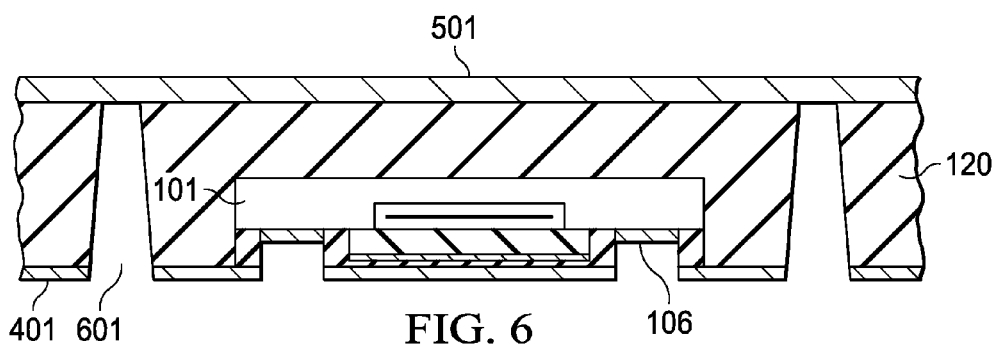

In the process steps shown in FIG. 6, etchants (alternatively lasers) are used to open windows into conductive foil 401 in places, where chip terminals 106 are located, and in other places, where via-holes are to be opened through board 120 from the side with foil 401 to the side with foil 501. Lasers are then used to remove the hardened polymeric adhesive on terminals 106 and expose the metal of the terminals, and further to drill through the bulk of board 120 to create the via-holes 601 and expose access to the conductive foils 501.

Figure 7:
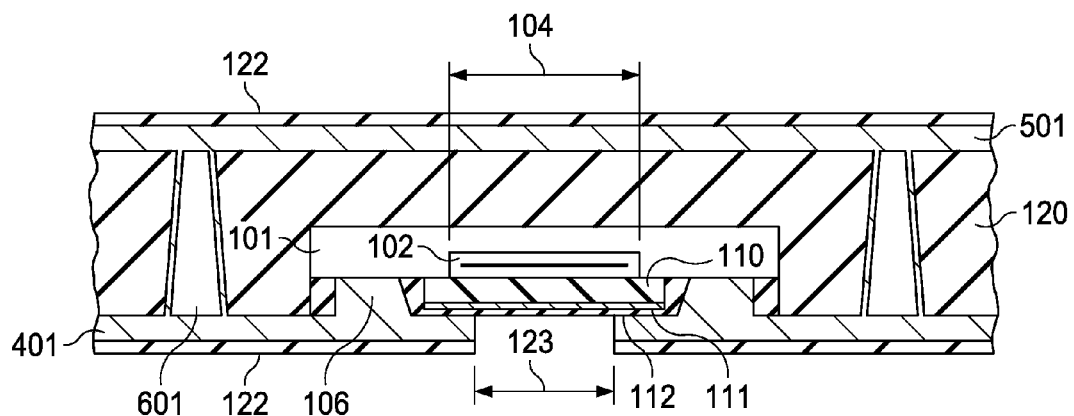

A number of process steps are summarized in FIG. 7. In a plating step, metal (preferably copper) is deposited on both sides of board 120. As results of this step, conductive layers 401 and 501 become thicker, electrical contacts are established between chip terminals 106 and foil 401, and via-holes 601 become electrically conductive.

In the following etching step, the plated metals as well as the conductive foil are removed from the center area of plate 110. The diameter of the opening is designated 123; in the example of FIG. 3, diameter 123 is shown significantly narrower than opening 104 of cavity 102. It should be noted that this etch step leaves the adhesive layer 112 on the metal film 111 over plate 110.

FIG. 7 also depicts the step of placing protective layers 122 on the sides of board 120. A preferred selection of material is a solder mask, since it can support device symbolization. The configuration of the solder mask retains the opening 123 in the center of the cover plate 110 over cavity 102.

Figure 8:
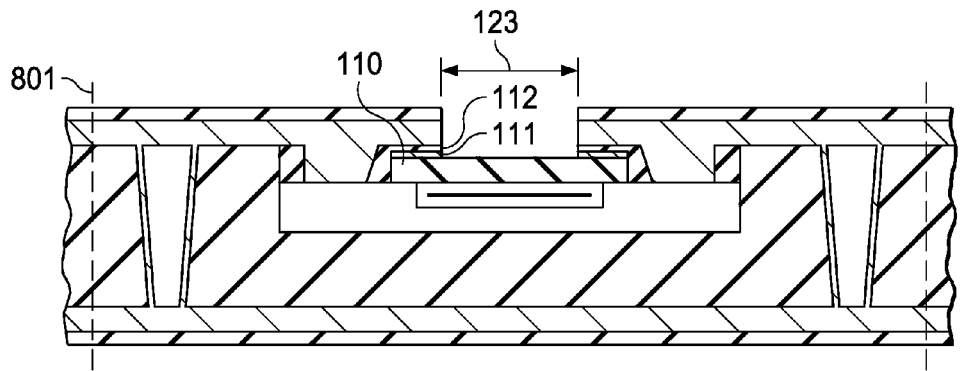

FIG. 8 illustrates the result of the next process steps. A laser, preferably a $CO_2$ laser, is used to remove the polymerized adhesive layer 112 exposed in opening 123 in the center of the cover plate 110. The progression of the laser is stopped by metal film 111. Next, a chemical etching technique is used to remove the metal film 111 across the center of cover plate 110. As mentioned, metal film 111 may be a titanium-tungsten layer of about 0.15 µm thickness on cover plate 110 stacked with a copper layer of about 0.20 µm thickness on the titanium-tungsten layer; alternatively, metal film 111 may just be copper. After the removal of metal film 111, the center area of plate 110 is bare so that the incoming radiation can reach the MEMS sensor through the plate.

In the next process step, not shown in FIG. 8, solder bumps may be attached to the metal at the board surface opposite chip 101. The result is indicated in FIG. 1. Alternatively, the connection to external parts may be accomplished by pressure contacts. Finally, the embedded sensor devices are singulated in individual units 100. The step of singulation is preferably performed by sawing through the board along lines 801. The individual units 100 may be placed in tape and reel for shipping.

Figure 9:
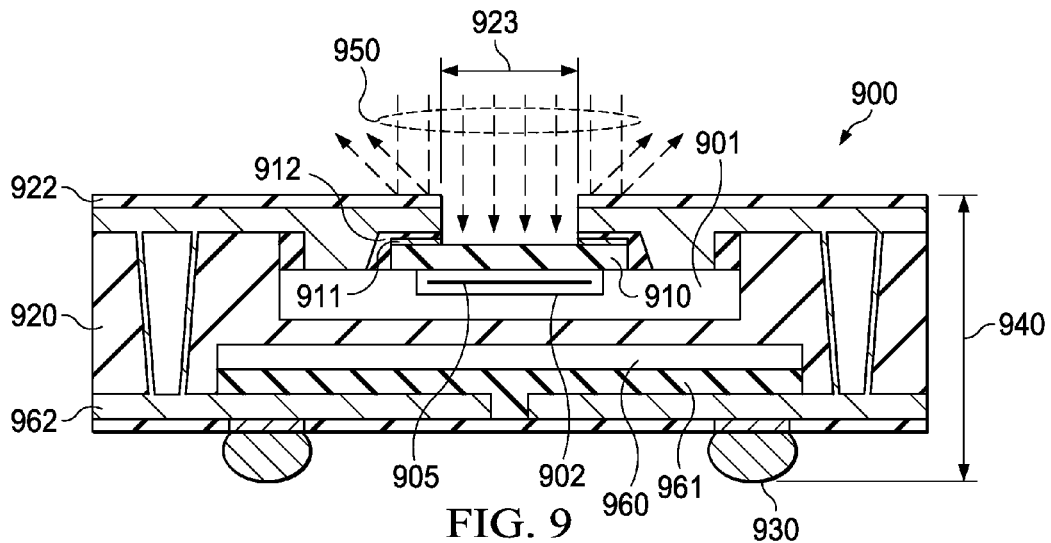
FIG. 9 shows another embodiment of the invention, a vertical stack of two semiconductor chips embedded in an insulating board, wherein one of the chips is a radiation-sensing MEMS in a cavity with plate-covered opening, and the other chips contains a microprocessor or a memory.

Another embodiment of the invention is illustrated in FIG. 9. The device, generally designated 900, includes a vertical stack of two semiconductor chips 901 and 960 embedded in an insulating board 920. One of the chips, designated 901, is a radiation-sensing MEMS 905 in a cavity 902 with plate-covered opening, and the other chip, designated 960, contains a microprocessor, a memory, or application-specific circuitry. Chip 901 has a cavity 902 including a radiation sensor MEMS 905; the opening 923 of the cavity at the chip surface is controlled by solder mask 922 and covered by a plate 910 transmissive to the radiation 950 sensed by the MEMS. The plate surface remote from the cavity has a bare central area, to be exposed to the radiation sensed by the MEMS in the cavity, and a peripheral area covered by a metal film 911 touching the plate surface and a layer 912 of adhesive stacked on the metal film. Chip 960 is attached to interconnecting metallization 962 by adhesive layer 961, which may be an unfilled epoxy compound. The thickness 940 of device 900, including solder bumps 930 for connection to external parts, is about 1 mm.

Figure 10:
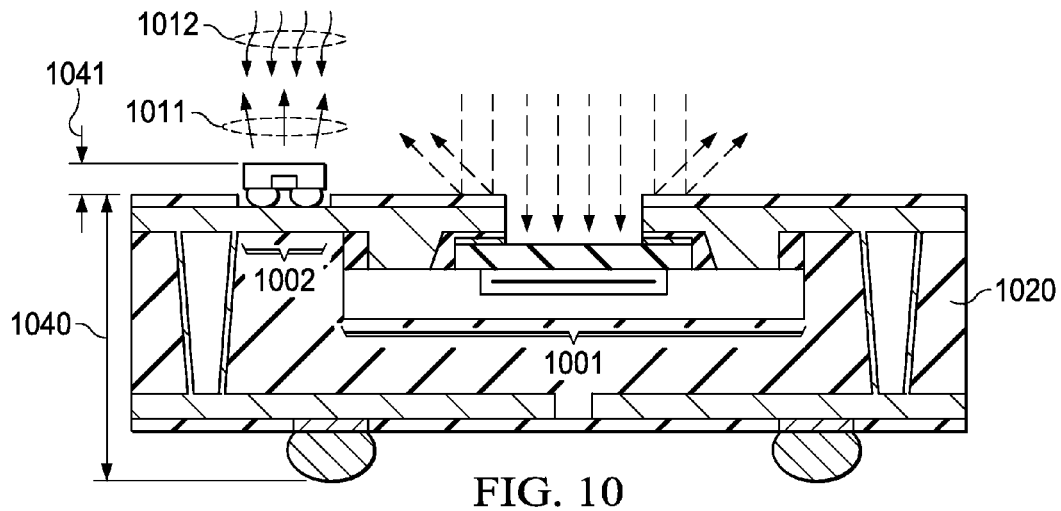
FIG. 10 depicts another embodiment of the invention, a combination of two MEMS; one of the MEMS is a board-embedded chip with a plate-covered cavity including a radiation sensor, the other MEMS may be an emitter of radiation, either embedded in or attached to the integration board, or may be another sensor responding to a different element.

FIG. 10 depicts another embodiment of the invention, a combination of two MEMS. One of the MEMS, designated 1001, is a board-embedded chip with a plate-covered cavity including a radiation sensor, as described in FIG. 1. The thickness 1040 of MEMS 1001 may be about 1 mm. The other MEMS, designated 1002 and preferably packaged in a chip-size package, may be an emitter of radiation 1011 suitable to sending out signals, either embedded in board 1020 (not shown in FIG. 10) or attached to the integration board 1020 (depicted in FIG. 10). Or it may be another sensor responding to a different element. This element may be a different kind of radiation 1012, or it may be related, for example, to gravitation, to moisture, to magnetic fields, or to organic entities or specific molecules. The thickness 1041 of MEMS 1002 may be 1 mm or less. The configuration of FIG. 10 allows sensing of different elements without the need of a barrier material; it facilitates proximity.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the invention applies to MEMS having parts moving mechanically under the influence of an energy flow (acoustic, thermal, or optical), a temperature or voltage difference, or an external force or torque. Certain MEMS with a membrane, plate or beam can be used as a pressure sensor (for instance microphone and speaker), inertial sensor (for instance accelerometer), or capacitive sensor (for instance strain gauge and RF switch); other MEMS operate as movement sensors for displacement or tilt; bimetal membranes work as temperature sensors.

It is therefore intended that the appended claims encompass any such modifications or embodiment.

We claim:

1. A method for fabricating a micro-electro-mechanical system (MEMS), comprising:
   providing a semiconductor chip having a cavity including a radiation sensor MEMS, the opening of the cavity at the chip surface covered by a plate transmissive to the radiation sensed by the MEMS; and
   placing a patterned metal film across the plate surface remote from the cavity, wherein the patterned metal film includes a titanium-tungsten layer of about 0.15 μm thickness on the cover plate and a copper layer of about 0.20 μm thickness on the titanium-tungsten layer.

2. A method for fabricating an embedded micro-electro-mechanical system (MEMS), comprising:
   providing a chip having a radiation-sensing MEMS in a cavity covered by a plate having a patterned metal film on the plate surface remote from the cavity;
   attaching the chip surface with the metal film onto a patterned conductive foil covered by a layer of adhesive;
   embedding the non-attached chip body in an insulating board; and
   removing from the cover plate sequentially portions of the conductive foil, then of the adhesive layer, and then of the metal film, thereby exposing the plate to the radiation to be sensed by the MEMS in the cavity.

3. The method of claim 2 wherein removing portions of the conductive foil includes a chemical etching technique.

4. The method of claim 2 wherein removing portions of the adhesive layer includes a laser technique.

5. The method of claim 2 wherein removing portions of the metal film includes another chemical etching technique.

6. The method of claim 2 wherein the chip surface further includes chip terminals connected to the MEMS.

7. The method of claim 2 further including connecting the chip terminals to the patterned conductive foil.

8. The method of claim 2 wherein the cover plate is made of a cured photoresist material having a thickness of about 15 μm.

9. The method of claim 2 wherein the protective metal film includes a titanium-tungsten layer of about 0.15 μm thickness on the cover plate and a copper layer of about 0.20 μm thickness on the titanium-tungsten layer.

* * * * *